United States Patent [19]

Kano et al.

[11] Patent Number: 5,464,520
[45] Date of Patent: Nov. 7, 1995

[54] SILICIDE TARGETS FOR SPUTTERING AND METHOD OF MANUFACTURING THE SAME

[75] Inventors: Osamu Kano; Koichi Yasui; Yasuyuki Sato; Yasuhiro Yamakoshi; Junichi Anan; Hironori Wada; Akio Yasuoka, all of Kitaibaraki, Japan

[73] Assignee: Japan Energy Corporation, Tokyo, Japan

[21] Appl. No.: 94,283

[22] Filed: Jul. 19, 1993

[30] Foreign Application Priority Data

Mar. 19, 1993 [JP] Japan ..................... 5-083941
Apr. 16, 1993 [JP] Japan ..................... 5-112517

[51] Int. Cl.$^6$ ..................... C23C 14/34; C22C 29/00; C22C 32/00
[52] U.S. Cl. ..................... 204/298.13; 75/245; 75/248; 419/10; 419/23; 419/26; 419/38; 204/298.12
[58] Field of Search ..................... 204/298.13, 298.12, 204/192.12, 192.15, 192.17, 192.22, 192.23; 419/10, 23, 26, 28, 32, 33, 34, 38; 75/245, 248

[56] References Cited

U.S. PATENT DOCUMENTS

| | | | |
|---|---|---|---|
| 4,663,120 | 5/1987 | Parent et al. | 419/10 |
| 4,750,932 | 6/1988 | Parent et al. | 75/228 |
| 4,938,798 | 7/1990 | Chiba et al. | 204/298.13 |

FOREIGN PATENT DOCUMENTS

| | | | |
|---|---|---|---|
| 0374931 | 6/1990 | European Pat. Off. | |
| 0483375 | 5/1992 | European Pat. Off. | |
| WO9118125 | 11/1991 | WIPO | 204/298.13 |

OTHER PUBLICATIONS

European Search Report concerning European Application No. EP 93112762.5, May 13, 1994 (2 pages).

*Primary Examiner*—R. Bruce Breneman
*Assistant Examiner*—Rodney G. McDonald
*Attorney, Agent, or Firm*—Panitch Schwarze Jacobs & Nadel

[57] ABSTRACT

Silicide targets for sputtering which have an area ratio of silicon phases that appear on the sputter surface of no more than 23%, and a density of at least 99%, with a deformed layer partly removed from the surface to attain a surface roughness of from more than 0.05 μm to 1 μm, preferably with the number of coarse silicon phases at least 10 μm in diameter that appear on the sputter surface being at most 10/mm$^2$. The reduction of early-stage particle generation, in turn, reduces secondary particle generation, thus realizing the reduction of particle generation at both early stage and stabilized stage. A Si powder having a maximum particle diameter of no more than 20 μm is mixed with a metal powder having a maximum particle diameter of no more than 60 μm, in a rather Si-lower mixing ratio. A silicide powder is synthesized from the mixture and hot pressed, the sintered compact being machined and surface treated for the removal of the deformed layer. The burden of the deformed layer-removal step on the process is light.

4 Claims, No Drawings

5,464,520

SILICIDE TARGETS FOR SPUTTERING AND METHOD OF MANUFACTURING THE SAME

FIELD OF THE INVENTION

This invention relates to silicide targets for sputtering and a method of manufacturing the same whereby the number of particles that generates from the target in sputtering and deposits on a substrate such as a wafer can be highly decreased from the prior art level. The silicide films formed by sputtering process using the silicide targets of this invention are useful for the films of large-scale integrated circuits that involve very narrow conductor lines. They are used in semiconductor devices such as new, higher integration extent (e.g., 4, 16, and 64-megabit) LSIs and VLSIs.

BACKGROUND OF THE INVENTION

Polysilicon has hitherto been used in electrodes or conductors of LSI semiconductor devices. The tendency toward higher integration of LSI semiconductor devices has caused to present the problem of delay in signal transmission due to its resistance. Meanwhile, there is a demand for higher-melting materials to be used as electrodes to facilitate the formation of conductors etc. by self-alignment technique. Under these circumstances, conductors and electrodes of metal silicides that possess lower electric resistivity than polysilicon and are compatible with the silicon gate process have come into use. Examples of the metal silicides are tungsten silicide ($WSi_x$), molybdenum silicides ($MoSi_x$), tantalum silicides ($TaSi_x$), titanium silicides ($TiSi_x$), cobalt silicides ($CoSi_x$), chromium silicides ($CrSi_x$), nickel silicides ($NiSi_x$), and silicides of platinum group metals.

A film of such a metal silicide is formed by sputtering a target of the metal silicide. The silicide target used often has a silicon/metal molar ratio greatly in excess of 2, because when a molar ratio x is less than 2, stresses in the film becomes higher as the film is formed and the film tends to peel away from a substrate.

Metal silicide targets are manufactured by mixing silicon powder and a specific metal powder in a silicon/metal molar ratio of 2 or more, synthesizing the mixture to a synthesized silicide powder, compressing and sintering the synthesized silicide powder, and then machining the sintered body to a desired shape.

The recent rise in the extent of integration of LSI semiconductor devices (e.g., to 4, 16, and 64-megabits) has reduced the width of their conductor lines finely to submicron levels. With this tendency the particles generated from the target are attracting attention as a subject of growing concern. The term "particles" as used herein means the particulate matters scattered and flew around from a target on sputtering of the target. The particles deposit directly on the film on a substrate or stick and build up on surrounding walls and parts and then come off to deposit on the film, inviting severe troubles such as breaking and shorting of conductor lines. The particle problem is becoming more and more serious with the progress of integration and refinement of the circuit of electronic devices. Thus it is noted anew that the conventional silicide targets are unsuitable for the VLSI applications because they generate too many particles during sputtering.

It has already been recognized in the art that coarse ones of free silicon phases contribute largely to the generation of particles from metal silicide targets. On the basis of this recognition, e.g., Japanese Patent Application Public Disclosure No. 191366/1992 discloses a metal silicide target of a refractory metal and Si characterized in that the average diameter of free Si particles is 30 μm or less and the number of free Si particles having diameters of 40 μm or more present in the surface and cross section of the target is 50 or less per square millimeter, and also a method of manufacturing the target. Patent Application Public Disclosure No. 1370/1993 previously filed by the present applicant imposes a stronger requirement, disclosing a metal silicide target characterized in that the number of coarse silicon phases 10 μm or larger in size that appears in the sputter surface of the target is 10 or fewer per square millimeter, and also a method of manufacturing the same.

Patent Application Public Disclosure No. 257158/1991, which is directed to a refractory metal alloy target rather than a silicide target to which the present invention relates, teaches that the surface roughness of the target is desirably 0.05 μm or less, on the basis of the discovery that the generation of particles is ascribable to the surface defect layer, surface conditions, residual stresses that result from the machining of the sintered body of target.

Our further practice has led to the new finding that the mere restriction of the number of coarse silicon phases 10 μm or larger that appear on the sputter surface of a metal silicide target is not satisfactory in that the number of particles generated is still considerable. In the case of the aforementioned Patent Application Public Disclosure No. 257158/1991, the surface roughness of the refractory metal alloy target is reduced to 0.05 μm or less with the view to removing the surface defective layer and residual stresses so as to eliminate the particles caused by them. The same surface treatment is considerable also to the metal silicide target, but surface conditioning down to 0.05 μm or less requires a very long time period in the case of the metal silicide target. With tungsten silicide, e.g., polishing the surface down to 0.04 μm by electropolishing that is the most ordinary surface treating means takes as long as 100 minutes. This means that the treatment is practically of no use. In the case of metal silicides the silicon phases take part in the generation of particles, so that the particles number is extremely numerous and is in the range from 7000 to 8000 per piece of wafer. Thus there is an urgent need for substantially decreasing the number of particles by technical means capable of easily being put to practical use.

OBJECT OF THE INVENTION

The object of the this invention is to establish a practically useful technology for the manufacture of silicide targets for sputtering wherein the number of particles generated is extremely lowered.

SUMMARY OF THE INVENTION

Our concentrated study on the way of solving the particle problem associated with metal silicide targets has now revealed that, in the case of metal silicide targets, the reduction of the area ratio of silicon phases on the target surface is a decisive controlling factor. It has now been found that only if the area ratio of Si phases is reduced to or below the tolerance in advance, it is possible at the time of removal of the deformed layer to decrease the number of early-stage particles satisfactorily only with surface treatment to a surface roughness ranging from more than 0.05 μm to about 1 μm. Specifically, it has now revealed that when the Si-phase area ratio of the target surface is reduced and the target density is increased, the number of particles generated can be adequately decreased by easily feasible surface treatment for a short period of about 10 minutes or so, i.e., by surface treatment to a surface roughness range from more than 0.05 μm to about 1 μm, preferably with concurrent fine division of the Si phase.

It has surprisingly been found that with a metal silicide target of the present invention one can sharply decrease the particle number to only 40 to 65 particles per 6-inch wafer as to particles of 0.3μm or larger in size, even with the firstly sputtered wafer, as compared with 7000 to 8000 particles per wafer that generates from a conventional metal silicide target. The aspect of dramatic drop in the number of particles generated is inherent to silicide targets and not observed with refractory metal targets.

On the basis of the above findings, the present invention provides (1) a silicide target for sputtering characterized in that the area ratio of silicon phases that appears on the sputter surface is 23% or less, the density is 99% or more, a deformed layer on the surface is partly removed, and the surface roughness ranges from more than 0.05 μm to 1 μm, and (2) a method of manufacturing a silicide target for sputtering having an area ratio of silicon phases that appears on the sputter surface of 23% or less, a density of 99% or more and a surface roughness ranging from more than 0.05 μm to 1 μm characterized by the steps of mixing a silicon powder having a maximum particle diameter of 20 μm or less with a metallic powder having a maximum particle diameter of 60 μm or less so that an area ratio of silicon phases that appears on the sputter surface is 23% or less, synthesizing the resulting powder mixture to a metal silicide powder, hot pressing the metal silicide powder to a sintered body having a density of 99% or more, machining the sintered body to predetermined dimensions, and then surface treating it to remove a part of the deformed layer so as to have a surface roughness ranging from more than 0.05 μm to 1 μm. It is preferable that the number of coarse silicon phases having a size of 10 μm or larger that appear on the sputter surface is 10 or fewer per square millimeter. The target material is, e.g., the silicide of a metal selected from the group consisting of titanium, tungsten, molybdenum, tantalum, chromium, cobalt, nickel, and platinum group metals.

DETAILED DESCRIPTION OF THE INVENTION

According to the present invention, the area ratio of silicon phases that appear on the sputter surface of a silicide target is specified to be 23% or less, whereby overall control of the probability of free silicon generation is effected. The target density is specified to be 99% or more so as to reduce the interstices or internal voids that can be a source of particle generation. By partly removing the deformed layer on the surface to attain a surface roughness of from more than 0.05 μm to 1 μm and more desirably, by making the Si phases finer so that the number of coarse silicon phases 10 μm or larger in diameter that appear on the sputter surface is 10 or fewer per square millimeter together, the number of the early-stage particles that come out mostly at the early stage of sputtering is substantially reduced, thereby sharply decreasing the number of particle generation. Moreover, the removal of the deformed layer can be accomplished in a short period of only about 10 minutes. The reduction of both the particle generation at the early stage and the generation at the stabilized stage is realized. If there are particles resulting from the early stage, they deposit on the target surface in a large number which possibly generate secondary particles during the stable sputtering period. The reduction of the early-stage particle generation lessens the possibility of the secondary particle generation.

The silicon powder as a starting material is prepared by grinding a raw material, such as polysilicon chips for semi-conductor use, e.g., on a ball mill in an argon atmosphere for 12 to 28 hours. Conventionally, such ground powder is used after sieving as it is, but under the invention the ground silicon is secondarily pulverized by a fine grinding mill so that coarse particles 20 μm or larger in size are eliminated. The pulverizing mill may be any commercially available fine grinding mill equipped with the means for protecting the charge from contamination. Examples of such pulverizing mill are as follows:

"Superfine Grinding Ang-Mill" ( manufactured by Hosokawa Micron Co., Ltd.)

"Supersonic Jet Grinder Models I and PJ" (by Nippon Pneumatic Industry Co., Ltd.)

"Current Jet" (by Nisshin Engineering Co., Ltd.)

"Single Track Jet Mill" (by Seishin Kigyo Co., Ltd.)

"New Superfine Grinding Mill" (by Kawasaki Heavy Industries Co. Ltd.)

"Counter-Jet Mill" (by Itoman Engineering Co., Ltd. )

The secondary pulverization eliminates coarse particles 10 μm or larger in size, especially particles larger than 8 μm, to almost zero.

As for the starting metal powder, a metal powder pulverized or finely crushed by a grinding equipment, e.g., a ball mill is used. The maximum particle diameter of the metal powder to be used, in terms of the agglomerated secondary particles, is 60 μm or less, preferably 20 μm or less. Examples of useful metals are titanium, tungsten, molybdenum, tantalum, chromium, cobalt, nickel, and platinum group metals.

Where titanium is chosen, the powder of titanium hydride may be used. Sputtering with a target having a high oxygen content is undesirable in that the liberation of oxygen leads to cracking of the target, oxidation of the resulting film, dispersion of film quality and other problems. The employment of titanium hydride ($TiH_2$) powder as a titanium source followed by dehydrating makes it possible to furnish a target with a reduced oxygen content. Another factor favoring the choice of titanium hydride is that the grinding becomes easier than titanium.

The metal and silicon powders as starting materials to be provided desirably have radioactive elements, alkali metals, transition metals, heavy metals, oxygen, etc. contents all reduced to but trace amounts. Raw material silicon powders ranging in purity from 5 to 9N (99.999~99.9999999 wt %) or even higher are commercially available with ease. With raw material metal powders too, the present applicant has already established a technology of reducing the contents, such as of radioactive elements, alkali metals, transition elements, and heavy metals, in tungsten, molybdenum, cobalt, tantalum, and other metals to just traces by a combination of chemical refining (recrystallization) and physical refining (arc melting).

The metal and silicon starting powders are mixed by a V-type mixer or the like in a Si/metal molar ratio as lower as possible than conventionally used ratios, so that the area ratio of silicon phases that ultimately appear on the sputter surface of the target is 23% or less, within the limits of allowance of the performance of the metal silicide thin film that is eventually formed. For example, the following molar ratios are recommended:

Si/Ti molar ratio=2.13

Si/W molar ratio=2.25
Si/Mo molar ratio=2.15
Si/Ta molar ratio=2.20
Si/Cr molar ratio=2.20
Si/Co molar ratio=2.20
Si/Ni molar ratio=2.20
Si/Pt molar ratio=1.20

It is a common procedure to add silicon in a slightly excess amount than the target amount for compensating the volatilization loss of silicon in the subsequent synthesis step. The amount of silicon to be lost by volatilization can be precisely known by calculation from the equipment and operation conditions to be used and desirably the excess amount of silicon should be a minimum.

The powder mixture is subjected to synthesis treatment in a high-temperature vacuum furnace. The reaction for synthesis is exothermic. The conditions for silicide synthesis are as follows:

Degree of vacuum: $10^{-3} \sim 10^{-5}$ Torr

Temperature: 800°~1300° C. (varies with metals)

Time: sufficient time for the synthesis reaction $M+xSi \rightarrow MSi_x$ (x=2.00~2.33; but, for platinum group metals x=1.00~1.26)

The metal silicide thus synthesized is cooled under vacuum, cooled down to 50° C. or below, and taken out of the furnace. The synthetic silicide is then pulverized by a ball mill, vibration mill, or other grinding apparatus and classified to give a synthetic silicide powder. Care must be paid to avoid an increase in the $O_2$ content during pulverization by a ball mill or the like, e.g., by performing it in an Ar-replaced atmosphere. To prevent the contamination with Fe or other impurities, it is desirable that the grinding mill use balls coated with or made of the same metal as that which is handled. It is also advisable to make the particle size of the synthetic silicide powder uniform by dry sieving it beforehand, preferably to 50 mesh or finer, more preferably to 200 mesh or finer.

Where an adjustment of the molar ratio is required, a silicide powder which is free from coarse silicon particles and has a molar ratio different from that of the synthesized silicide is added according to the necessity. The silicide powder to be added is also of a size that passes through a 50-mesh sieve, preferably a 200-mesh sieve. The synthesized silicide powder and the additional silicide powder are thoroughly mixed using, e.g., a V-type mixer. The adjustment of composition with a silicide powder, not silicon powder, before hot pressing helps prevent the generation of particles caused from the use of agglomerated silicon, since free Si particles entrapped in the silicon agglomerate are partly responsible for the particle generation. Thus the addition of silicide powder rather than the silicon powder that easily agglomerate for the compositional adjustment prior to hot pressing further inhibits the generation of particles.

Hot pressing is then carried out. It is important that this step be so implemented as to compact the silicide powder to adequately high density. Application of a preload to the compact at the time of hot pressing and holding the state for some time after the pressing is a recommended practice. The conditions for hot pressing are as follows:

Degree of vacuum: $10^{-5} \sim 10^{-6}$ Torr

Temperature: 900°~1380° C.

Press pressure: 250~600 kg-cm$^2$

Time: 30 min.~3 hr.

Holding time: the longer the better, the minimum period being 30 min.

For the hot pressing the metal silicide powder is placed in a press mold and the temperature is increased. When a target temperature between 900° C. and 1380° C. has been reached, the application of a predetermined press pressure is initiated while the above temperature level is being maintained. The application of the pressure gradually reduces the thickness of the green compact. Past a given time point the compact thickness becomes constant and no more reduction of thickness takes place. In this state the application of the press pressure usually is discontinued. To achieve higher density it is effective to apply a preload to the compact at the time of pressing and hold it for some time, say 30 minutes or more, after the above time point. For the purposes of the invention this procedure is called "holding". In this way a high-density sintered body having a density of 99% or more is obtained.

Pressing a compact of fine synthetic silicide powder at elevated temperature for sufficient period of time allows sintering among particles to proceed until a uniform sintered structure results. The hot pressing in this invention must be solid-phase sintering. Many methods of the prior art produce a liquid phase at the time of sintering, which has been known to be prone to particle generation. It is for this reason that the this invention effects solid-phase sintering under the specified conditions.

After the pressing, the pressed body is taken out and finished as a sputtering target by machining to specified dimensions. Finally the target is subjected to a deformed layer-removal step that is incorporated under this invention whereby the deformed layer is partly removed from the target to smoothen the surface. The process of deformed layer removal is performed by ion milling, sputtering, electropolishing, chemical etching, lapping, chemical polishing, or other suitable technique for surface treatment. These techniques are all well-known as deformed layer-removal steps by which a target surface layer of from 20 to 100 μm thickness is removed strain-free. Such a surface treatment decreases the surface roughness ($R_a$) from the pretreatment value of about 5.0 μm to 1.0 μm or less. There is no need of reducing the surface roughness to less than 0.05 μm previously proposed in connection with a refractory metal alloy target. The present invention specifies that the surface roughness should be in excess of 0.05 μm so that the deformed layer-removal step can be concluded within a short period of about 10 minutes or so. This step is followed by ultrasonic cleaning with isopropyl alcohol or the like and vacuum drying to provide a product completely freed from the contaminants that had deposited on the surface during the surface treatment. Lastly, the target thus obtained is bonded to a backing plate.

The deformed layer-removal step, along with the limitation of the area ratio of silicon phases appearing on the sputter surface to 23% or less, has been found very effective for controlling the early-stage particle generation. In the case of a metal silicide target, a considerable amount of particles are generated at the early stage of sputtering and these particles deposit, e.g., on the inner walls of equipment, build up, and come off onto the film. Controlling the earlystage particle generation, therefore, reduces substantially the total number of particles that deposit on a wafer. In other words, once the area ratio of silicon phases that appear on the sputter surface is limited to 23% or less, a deformed layer-removal step carried out for a short period of but about 10 minutes to achieve a surface roughness between more than 0.05 and 1 μm would control the early-stage particle generation satisfactorily.

Thus a metal silicide target is realized which has an area ratio of silicon phases appearing on the sputter surface of 23% or less, preferably with the number of coarse silicon phases 10 µm or larger in size that appears on the sputter surface being 10 or fewer per square millimeter, and which also has a density of 99% or more, with a surface roughness in the range from more than 0.05 µm to 1 µm attained by the removal of the deformed layer from the surface. The area ratio of silicon phases that appear on the sputter surface is restricted and thereby the overall control of the probability of free silicon generation is effected. Also, through the control of both the particle size of the starting powder and the process of synthesis and sintering, the number of coarse silicon phases 10 µm or larger in diameter that appear on the sputter surface is restricted to 10 or fewer per square millimeter, the target density is specified to be 99% or more so as to reduce the interstrices, and the deformed layer on the surface is removed to attain a surface roughness of from more than 0.05 µm to 1 µm. These restrictions are combined successfully to reduce the number of particle generation substantially as compared with the conventional silicide target. The beneficial effect of reducing the area ratio of silicon phases to 23% or less, preferably with the number of coarse silicon phases 10 µm or larger in diameter that appear on the sputter surface being restricted to 10 or fewer per square millimeter has been confirmed after a great deal of experimentation. The severe requirement as to the decrease of the proportion of the silicon phases that occur and their severe size reduction as compared with the prior art levels, plus other requirements have now made possible the amazing decrease in particle generation with high reliability. These restrictions impose practically no burden on the target manufacturing process.

The area ratio of silicon phases that appear on the sputter surface and the number of coarse silicon phases 10 µm or larger in diameter that occur were measured and counted visually under a microscope with a magnification of 100 ×.

EXAMPLES

The invention is illustrated by the following examples and comparative examples.

Example 1

An Si powder ground by a ball mill for 14 hours was passed through a 200 mesh sieve, and the Si powder so obtained was finely ground by a counter jet mill until the maximum particle diameter was 8 µm. This Si powder and a tungsten powder with a maximum particle diameter of 45 µm were mixed in a ratio Si/W=2.13, and a tungsten silicide powder was synthesized from the mixture at a temperature of 1000° C. The tungsten silicide powder was hot pressed at 1200° C., and the sintered compact was machined and then electropolished for 10 minutes for surface treatment and then bonded to a base as a sputtering target.

This tungsten silicide target was characterized by: Si/W= 2.13; area ratio of Si phases that appeared on the sputter surface=14%; number of Si phases 10 µm or larger in diameter that appeared on the sputter surface=100/mm$^2$; density=99.8%; and surface roughness $R_a$=0.5 µm.

A tungsten silicide film was formed by sputtering using this target, and the numbers of particles resting on wafers were counted by the laser method. Particles 0.3 µm or larger in diameter numbered 65 on the first of 6-in. wafers, 35 on the second, and 25 on the average on the 30th and subsequent wafers.

Example 2

In the same way as described in Example 1, a tungsten silicide target of the characteristics given below was made. Here a finer tungsten powder than the powder of the Example 1, with a maximum particle diameter of 20 µm was used. The electropolishing was again carried out for 10 minutes.

The tungsten silicide target was characterized by: Si/W= 2.26; area ratio of Si phases that appeared on the sputter surface=20%; number of Si phases 10 µm or larger in diameter that appeared on the sputter surface density= 99.8%; and surface roughness $R_a$=0.6 µm.

A tungsten silicide film was formed by sputtering using this target, and the numbers of particles resting on wafers were counted by the laser method. Particles 0.3 µm or larger in diameter numbered 50 on the first of 6-in. wafers, 33 on the second, and 25 on the average from the 30th wafer onward.

Example 3

A molybdenum powder was used but otherwise in the same manner as in Example 1, a molybdenum silicide target having the characteristics mentioned below was made. The molybdenum powder was finer than the powder of Example 1, with a maximum particle diameter of 20 µm. The electropolishing was again carried out for 10 minutes.

The molybdenum silicide target was characterized by: Si/Mo= 2.12; area ratio of Si phases that appeared on the sputter surface=13%; number of Si phases 10 µm or larger in diameter that appeared on the sputter surface=1/mm$^2$; density=99.8%; and surface roughness $R_a$=0.4 µm.

A molybdenum silicide film was formed by sputtering using this target, and the numbers of particles on wafers were counted by the laser method. Particles 0.3 µm or larger in diameter numbered 40 on the first of 6-in. wafers, 25 on the second, and but 18 on the average from the 30th wafer onward.

Comparative Example 1

An Si powder with a maximum particle diameter of 8 µm and a W powder with a maximum particle diameter of 45 µm were mixed in a ratio Si/W=2.60 so that the mixture had higher in Si content than in Example 1, and a tungsten silicide powder was synthesized from the mixture in the manner described in Example 2. The tungsten silicide powder was hot pressed, and the sintered compact was machined and then bonded to a base to form a sputtering target. The surface treated by electropolishing was not conducted. The target had a surface roughness of 5 µm.

This tungsten silicide target was characterized by: area ratio of Si phases that appeared on the sputter surface=30%; number of Si phases 10 µm or larger in diameter that appeared on the sputter surface=3/mm$^2$; density=99.8%; and surface roughness $R_a$=5.0 µm.

A tungsten silicide film was formed by sputtering using this target, and the numbers of particles on wafers were counted by the laser method. Particles 0.3 µm or larger in diameter numbered 150 on the first of 6-in. wafers, 120 on the second, and then gradually decreased to 35 on the 30th wafer. The average particle level on the subsequent wafers was 30. Since the Si area ratio was large and the surface was not treated, the early-stage particle generation was considerable, and the average of the numbers of particles on the 30th and following wafers was high.

Comparative Example 2

The procedure of Example 2 was repeated to form a tungsten silicide target. The only exception was extension of the electropolishing time to 100 minutes, whereby the surface roughness was decreased to 0.04 μm.

This tungsten silicide target was characterized by: area ratio of Si phases that appeared on the sputter surface=20%; number of Si phases 10 μm or larger in diameter that appeared on the sputter surface=3/mm$^2$; density=99.8%; and surface roughness $R_a$=0.04 μm.

A tungsten silicide film was formed by sputtering using this target, and the numbers of particles on wafers were counted by the laser method. Particles 0.3 μm or larger in diameter numbered 48 on the first of 6-in. wafers, 33 on the second, and the average of the numbers of particles on the 30th and subsequent wafers was 25. It can be seen that, despite the electropolishing performed for ten times as long as in Example 2, the number of particles differed little from the second wafer onward.

The results are summarized in Table 1.

Example 5

A target was made in exactly the same manner as in Example 4 with the only exception that the TiH$_2$ powder as the titanium material powder was replaced by a Ti powder (maximum particle diameter 45 μm). The results were entirely the same as those of Example 4.

Comparative Example 3

An Si powder with a maximum particle diameter of 8 μm and a Ti powder with a maximum particle diameter of 45 μm were mixed in a ratio Si/Ti=2.65 so that the mixture contained more Si, and a titanium silicide powder was synthesized from the mixture in the manner described in Example 5. The titanium silicide powder was hot pressed, and the sintered compact was machined, surface treated, and then bonded to a base to finally form a sputtering target of TiSi$_{2.60}$.

This TiSi$_{2.60}$ target showed: area ratio of Si phases that appeared on the sputter surface=30.0%; number of Si phases

TABLE 1

|  |  | Example 1 | Example 2 | Example 3 | Comparative Example 1 | Comparative Example 2 |
|---|---|---|---|---|---|---|
| Si phase | Area ratio | 14% | 20% | 13% | 30% | 20% |
|  | Number present* | 100 | 3 | 1 | 3 | 3 |
| Density |  | 99.8 | 99.8 | 99.8 | 99.8 | 99.8 |
| Surface treatment |  |  | Electropolishing |  | None | Electropolishing |
| Treating time |  | 10 min. | 10 min. | 10 min. | — | 100 min. |
| Surface roughness |  | 0.5 μm | 0.6 μm | 0.4 μm | 5.0 μm | 0.04 μm |
| Numbr of particles# |  |  |  |  |  |  |
| 1st wafer |  | 65 | 50 | 40 | 150 | 48 |
| 2nd wafer |  | 35 | 33 | 25 | 120 | 33 |
| 30th & subsequent wafers average |  | 25 | 25 | 18 | 30 | 25 |

*: Number present of coarse silicon phase 10 μm or larger in diameter (per square millimeter)
: Number of particles 0.3 μm or larger in diameter on a 6-in. wafer.

Example 4

An Si powder ground by a ball mill for 14 hours was passed through a 200 mesh sieve, and the Si powder thus obtained was finely ground by a counter jet mill until the maximum particle diameter was 8 μm. This Si powder and a TiH$_2$ powder with a maximum particle diameter of 45 μm were mixed in a ratio Si/Ti=2.15. The mixture was dehydrogenated at 600° C., and a titanium silicide powder was synthesized from the mixture at a temperature of 1000° C. The titanium silicide powder was hot pressed at 1200° C., and the sintered compact was machined, surface treated, and bonded to a base as a sputtering target.

This target was characterized by: Si/Ti=2.13; area ratio of Si phases that appeared on the sputter surface=13.4%; number of Si phases 10 μm or larger in diameter that appeared on the sputter surface=0/mm$^2$; density=99.8%; and surface roughness $R_a$=0.6 μm.

A titanium silicide film was formed by sputtering using this target, and the number of particles found on a wafer was counted by the laser method. Particles 0.5 μm or larger in diameter numbered but 5 on a 6-in. wafer.

10 μm or larger in diameter that appeared on the sputter surface=0/mm$^2$; density=99.9%; and surface roughness $R_a$32 0.6 μm.

A titanium silicide film was formed by sputtering using this target, and the number of particles on a wafer was counted by the laser method. Particles 0.5 μm or larger in diameter numbered 150 on a 6-in. wafer. Since the Si proportion was larger, the Si/Ti being 2.65, the area ratio of Si phases that appeared on the sputter surface too was as large as 30.0%, causing increased particle generation.

Comparative Example 4

In a similar procedure, a sputtering target with Si/Ti=2.13 was eventually made from a Si powder containing large particles with a maximum particle diameter of 45 μm and a Ti powder with a maximum particle diameter of 45 μm.

This TiSi$_{2.13}$ target had: area ratio of Si phases that appeared on the sputter surface=13.4%; number of Si phases 10μm or larger in diameter (maximum Si phase size 45 μm) that appeared on the sputter surface=40/mm$^2$; density= 99.8%; and surface roughness $R_a$=0.6 μm.

A titanium silicide film was formed by sputtering using this target, and the number of particles on a wafer was counted by the laser method. Particles 0.5 µm or larger in diameter numbered 500 on a 6-in. wafer. Since a Si powder with a large maximum particle diameter was used, the Si phase size was large and the number of particles increased.

Comparative Example 5

The procedure of Example 4 was repeated to form a $TiSi_{2.13}$ titanium silicide target, except that the final product was obtained without the removal of the deformed layer. The target had a surface roughness of 5 µm. The number of particles 0.5 µm or larger that resulted from the use of this target and found on a 6-in. wafer was 500. This indicates the importance of removing the deformed layer from the target surface.

ADVANTAGE OF THE INVENTION

The particle problem associated with the use of metal silicides have been tackled from the practical point of view. The number of particle generation has now been successfully reduced to a great extent for practical purposes by slightly decreasing the silicon/metal molar ratio to lower the area ratio of silicon phases that appear on the sputter surface, increasing the target density adequately, and partially removing the deformed layer from the target surface, preferably with the control of the amount of coarse silicon phases 10 µm or larger in size that appear on the sputter surface. This invention thus contributes to the practical application of metal silicides that have much promising future as films for higher integrated LSIs with narrower conductor lines than before, to the semiconductor devices of tomorrow, e.g., higher integration-scale (4, 16, and 64-megabit) LSIs and VLSIs. The early-stage particle generation inherent to metal silicides has been reduced advantageously through the control of the ,area ratio of silicon phases and through a surface treatment that takes but about 10 minutes. Since the reduction of the early-stage particle generation, in turn, reduces the secondary particle generation, the reduction of particle generation in both early stage and stable period is now realized.

What is claimed is:

1. A silicide target for sputtering, where the target has a surface and the surface has at least one area comprising silicon phase, and an area ratio of silicon phases defined as the ratio of the total area of the surface silicon phases to the total area of the silicide target, said target characterized in that the area ratio of silicon phases that appears on the sputter surface is 23% or less, the number of coarse silicon phases 10 µm or larger in diameter that appear on the sputter surface is no more than 10 per square millimeter, the density is 99% or more, a deformed layer on the surface is partly removed, and the surface roughness, $R_a$, is $0.05\ \mu m < R_a \leq 1$ µm.

2. The target of claim 1 wherein the target material is a silicide of a metal selected from the group consisting of titanium, tungsten, molybdenum, tantalum, chromium, cobalt, nickel, and platinum group metals.

3. A method of manufacturing a silicide target for sputtering, where the target has a surface and the surface has at least one area of silicon phase, said target having an area ratio of silicon phases defined as the ratio of the total area of the surface silicon phases to the total area of the silicide target, and where the target has an area ratio of silicon phases that appears on the sputter surface of 23% or less, the number of coarse silicon phases 10 µm or larger in diameter that appear on the sputter surface is no more than 10 per square millimeter, a density of 99% or more and a surface roughness, $R_a$, wherein $0.05\ \mu m < R_a \leq 1$ µm, characterized by the steps of:

mixing a silicon powder having a maximum particle diameter of 20 µm or less with a metal powder having a maximum particle diameter of 60 µm or less so that an area ratio of silicon phases that appears on the sputter surface is 23% or less, synthesizing the resulting powder mixture to a metal silicide powder, hot pressing the metal silicide powder to a sintered body having a density of 99% or more, machining the sintered body to target dimensions, and then surface treating it to remove a part of the deformed layer so as to have a surface roughness, $R_a$, wherein $0.05\ \mu m < R_a \leq 1$ µm.

4. The method of claim 3 wherein the target material is a silicide of a metal selected from the group consisting of titanium, tungsten, molybdenum, tantalum, chromium, cobalt, nickel, and platinum group metals.

* * * * *